(12) United States Patent
Marinero et al.

(10) Patent No.: US 8,227,842 B2
(45) Date of Patent: Jul. 24, 2012

(54) QUANTUM WELL GRAPHENE STRUCTURE

(75) Inventors: Ernesto E. Marinero, Saratoga, CA (US); Simone Pisana, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 192 days.

(21) Appl. No.: 12/563,446

(22) Filed: Sep. 21, 2009

(65) Prior Publication Data

US 2011/0068320 A1    Mar. 24, 2011

(51) Int. Cl.
    *H01L 29/76* (2006.01)
(52) U.S. Cl. ............... 257/288; 257/E27.029; 977/734; 977/738
(58) Field of Classification Search .......... 257/288, 257/295, 421, 623, E27.006, E27.029; 977/734, 977/738
See application file for complete search history.

(56) References Cited

U.S. PATENT DOCUMENTS

| | | | |
|---|---|---|---|
| 6,955,968 B2 * | 10/2005 | Forbes et al. | 438/266 |
| 7,015,142 B2 | 3/2006 | DeHeer et al. | 438/689 |
| 7,170,120 B2 | 1/2007 | Datta et al. | 257/288 |
| 7,262,991 B2 | 8/2007 | Zhang et al. | 365/185.01 |
| 7,301,199 B2 * | 11/2007 | Lieber et al. | 257/327 |
| 7,342,277 B2 | 3/2008 | Radosavljevic et al. | 257/314 |
| 7,385,262 B2 | 6/2008 | O'Keeffe et al. | 257/401 |
| 7,858,990 B2 * | 12/2010 | Chen et al. | 257/76 |
| 2006/0197107 A1 * | 9/2006 | Kanamura et al. | 257/194 |
| 2008/0001158 A1 * | 1/2008 | Das et al. | 257/77 |
| 2008/0128713 A1 * | 6/2008 | Saito et al. | 257/86 |
| 2008/0191196 A1 * | 8/2008 | Lu et al. | 257/27 |
| 2009/0020764 A1 | 1/2009 | Anderson et al. | 257/77 |
| 2009/0315554 A1 * | 12/2009 | Witcraft et al. | 324/260 |
| 2010/0105834 A1 * | 4/2010 | Tour et al. | 525/50 |
| 2010/0127243 A1 * | 5/2010 | Banerjee et al. | 257/39 |
| 2010/0136756 A1 * | 6/2010 | Chae et al. | 438/158 |
| 2010/0301336 A1 * | 12/2010 | Babich et al. | 257/57 |

(Continued)

FOREIGN PATENT DOCUMENTS

JP    2008/205272    9/2008

OTHER PUBLICATIONS

Kedzierski, Jakub et al., "Epitaxial Graphene Transistors on SiC Substrates" IEEE Transactions on Electron Devices, vol. 55, No. 8, Aug. 2008.

(Continued)

*Primary Examiner* — Evan Pert
*Assistant Examiner* — Eduardo A Rodela
(74) *Attorney, Agent, or Firm* — Zilka-Kotab, PC

(57) ABSTRACT

An electronic device employing a graphene layer as a charge carrier layer. The graphene layer is sandwiched between layers that are constructed of a material having a highly ordered crystalline structure and a high dielectric constant. The highly ordered crystalline structure of the layers surrounding the graphene layer has low density of charged defects that can lead to scattering of charge carriers in the graphene layer. The high dielectric constant of the layers surrounding the graphene layer also prevents charge carrier scattering by minimizing interaction between the charge carriers and the charged defects in the surrounding layers. An interracial layer constructed of a thin, non-polar, dielectric material can also be provided between the graphene layer and each of the highly ordered crystalline high dielectric constant layers to minimize charge carrier scattering in the graphene layer through remote interfacial phonons.

18 Claims, 6 Drawing Sheets

U.S. PATENT DOCUMENTS

2011/0017979 A1* 1/2011 Meric et al. .................. 257/29
2011/0042650 A1* 2/2011 Avouris et al. ................ 257/29
2011/0059599 A1* 3/2011 Ward et al. ................... 438/507

OTHER PUBLICATIONS

Sevinçli, H. et al., "Multiple Quantum Well Structures of Graphene" arXiv:0711.2414v1 [cond-mat.mes-hall] Nov. 15, 2007.

Kim, Seyoung et al., "Realization of a High Mobility Dual-gated Graphene Field Effect Transistor with $Al_2O_3$ Dielectric" arXiv 0901.2901v1.

Ratnikov, P.V. et al., "Quantum Well Based on Graphene and Narrow-Gap Semiconductors" Bulletin of the Lebedev Physics Institute, 2009, vol. 36, No. 2, pp. 34-43, Allerton Press, Inc. 2009.

Oostinga, Jeroen B. et al., "Gate-induced insulating state in bilayer graphene devices", Nature Publishing Group, vol. 7, Feb. 2008, www.nature.com/naturematerials.

Semenov, Y.G. et al., "Spin field effect transistor with a graphene channel" American Institute of Physics, Applied Physics Letters 91, 153105 (2007).

Kim, Seyoung et al., "Realization of a High Mobility Dual-gated Graphene Field Effect Transistor with Al203 Dielectric" arXiv:0901.2901v1 [cond-mat.mes-hall].

Sevinçli, H. et al., "Superlattice Structures of Graphene based Nanoribbon" arXiv:0711.2414v3 [cond-mat.mes.hall] Mar. 25, 2008.

Ryzhii, V. et al., "Plasma waves in two-dimensional electron-hole system in gated graphene heterostructures" Journal of Applied Physics 101, 024509 (2007).

Koinov, Z. G. "Magnetoexciton dispersion in graphene bilayers embedded in a dielectric" The American Physical Society, Physical Review B 79, 073409 (2009).

Bolotin, K.I. et al., "Ultrahigh electron mobility in suspended graphene" www.elsevier.com/locate/ssc, Solid State Communications 146 (2008) 351-355.

Lemme, M.C. et al., "Mobility in Graphene Double Gate Field Effect Transistors" Solid State Electronics, vol. 52, Issue 4, pp. 514-518, 2008.

* cited by examiner

QUANTUM WELL GRAPHENE STRUCTURE

FIELD OF THE INVENTION

The present invention relates generally to nano-scale electronic circuitry and more particularly to nano-scale circuitry employing a graphene charge carrier surrounded by compatible, protective material layers.

BACKGROUND OF THE INVENTION

In the push for ever decreased size and increased density and switching speed in microelectronic devices, researchers have constantly sought ways to construct smaller charge carriers with high carrier mobility. Graphene has shown promise as an extremely attractive material for such microelectronic applications. For example, it exhibits intrinsic mobilities of the order of 10 $m^2/Vs$, two dimensional charge carrier concentrations of the order of $10^{12}/cm^2$ at room temperature, and carrier velocity of $10^6$ m/s, which would enable transistor operation at THz speeds. However, interactions with support materials, over-layers and the environment are known to negatively impact its transport characteristics.

Graphene is a single atomic sheet of graphitic carbon atoms that are arranged into a honeycomb lattice. It can be viewed as a giant two-dimensional Fullerene molecule, an unrolled single wall carbon nano-tube, or simply a single layer of lamellar graphite crystal. While the intrinsic mobility of graphene is limited by scattering with longitudinal acoustic phonons in its lattice, devices fabricated so far have been subject to additional scattering sources. The dominant sources of extrinsic scattering are long range scattering centers such as charged impurities on or near its surface and remote interfacial phonons originating from the support or over-layers. Other contributions to scattering arise from short range scattering centers such as point defects and corrugations of the lattice.

Therefore, there is a need for a structure that can allow the practical application of a material such as graphene, while mitigating the above described challenges resulting from the effects of scattering and other issues inherent in the use of graphene.

SUMMARY OF THE INVENTION

The present invention provides an electronic device that includes an under-layer constructed of a highly ordered crystalline material having a high dielectric constant and an over-layer constructed of a crystalline material having a high dielectric constant. A layer of graphene is located between the over-layer and the under-layer.

In another embodiment of the invention, an interfacial layer constructed of a thin layer of dielectric, non-polar material can be sandwiched between the graphene layer and each of the under-layer and over-layer.

Constructing the under-layer and over-layer of a highly ordered crystalline material allows the under-layer and over-layer to have very few imperfections. This prevents the accumulation of charge at the impurities that would act as scattering centers of charge carriers traveling through the adjacent graphene layer.

The scattering of charge carriers is further reduced by screening any residual charge in the under-layer and over-layer by employing a high dielectric constant material for the under-layer and over-layer. This results in the best possible performance of the graphene layer as a pathway for the conduction of charge carriers.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
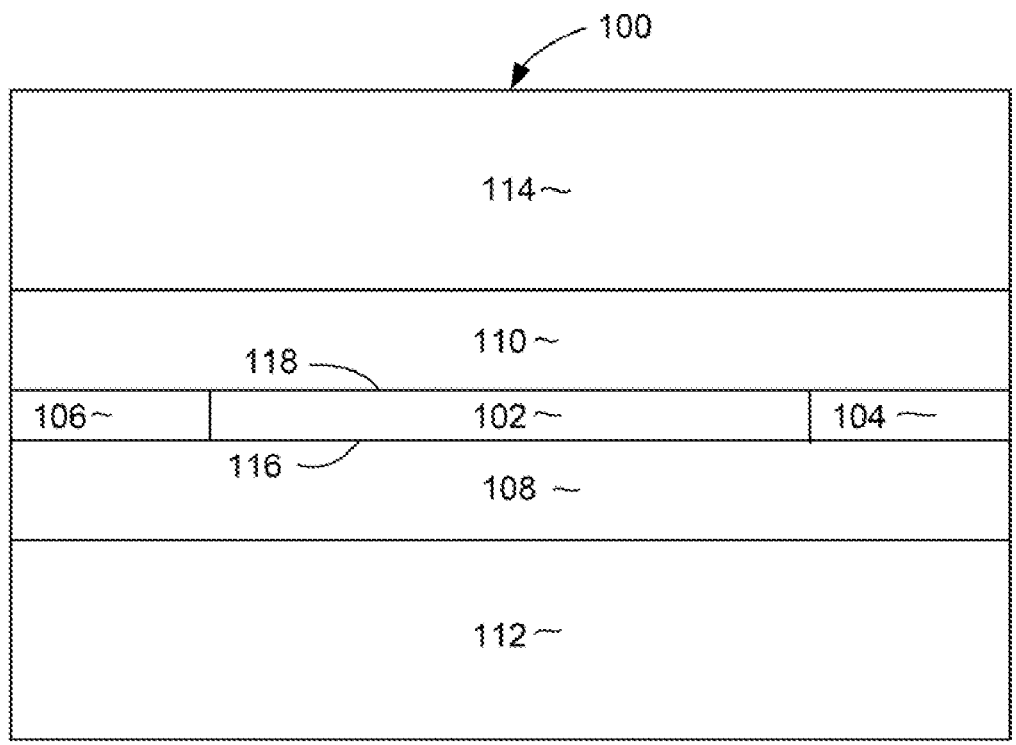
FIG. 1 is a schematic, cross sectional view of a structure employing graphene according to an embodiment of the invention.

With reference to FIG. 1, a structure 100 is shown wherein a graphene layer 102 is employed for conducting charge carriers. As discussed above graphene is a single atomic sheet of graphitic carbon atoms that are arranged into a honeycomb lattice. It can be viewed as a giant two-dimensional Fullerene molecule, an unrolled single wall carbon nanotube, or simply a single layer of lamellar graphite crystal. Graphene exhibits excellent transport characteristics, having intrinsic mobility on the order of 10 $m^2/Vs$. The n-graphene layer 102 can be a single layer or a plurality of n single layers of graphene and preferably includes n=1 to n=10 single layers of graphene. Since a single graphene layer has a thickness of only a single carbon atom an n-graphene layer 102 of one or several single layers of graphene can be viewed as a two dimensional electron gas, 2DEG, or a two dimensional hole gas if the charge carriers flowing there-through are holes rather than electrons.

With continued reference to FIG. 1, a pair of electrical contacts 104, 106 can be formed at opposite ends of the n-graphene layer 102 to provide charge carriers to the n-graphene layer 102. The n-graphene layer 102 is sandwiched between an under-layer 108 and an over-layer 110. These layers 102-110 can be formed on a substrate material 112, the material of which may vary depending on the application of the device 100, and may be covered by an overcoat 114, which again may be of various materials.

While the intrinsic mobility of graphene is limited by scattering with longitudinal acoustic phonons in its lattice, devices proposed so far have been subject to additional scattering sources. The dominant sources of extrinsic scattering are long range scattering centers such as charged impurities on or near its surface and remote interfacial phonons originating from support or over-layers. Further contributions to scattering arise from short range scattering centers such as point defects and corrugations of the lattice. With suitable choices of interface materials for the under-layer 108, and over-layer 110 it is possible to limit or eliminate strong scattering and fabricate devices having mobilities close to the intrinsic limit. Furthermore, the encapsulation of the graphene layer or layers reduces the effect of contamination from the environment and provides additional protection from physical damage, thereby ensuring device reliability. Most device structures fabricated previously employ $SiO_2$ obtained by thermal oxidation of Si as a supporting material. This material is known to include defects that can harbor electrical charge, thereby providing a source of charged impurity scattering. Similar high band-gap materials of common use such as thermally evaporated or sputtered oxides or amorphous materials obtained by chemical vapor deposition suffer from similar limitations. Further sources of charged impurities can originate from surface contamination or adsorbed gas molecules. We therefore propose two approaches to either minimize the presence of charged impurities or to reduce their scattering effect.

To minimize the presence of charged impurities, the under-layer 108 and over-layer 110 are constructed of a dielectric material with a high crystalline order. This reduces the presence of defects that act as charge traps. Furthermore, to reduce the scattering effect from charged impurities, a material with high dielectric constant can screen the electric field from the impurities and hence reduce its coupling to the charge carriers within the n-graphene layer 102.

Remote interfacial phonon scattering originates from the coupling of polar optical phonon modes of the support with charge carriers within the n-graphene layer 102. Careful selection of materials of the under-layer 108 and over-layer 110 can reduce the strength of the scattering phonon modes and their coupling with the charge carriers in the n-graphene layer 102. This can be achieved by choosing materials for the layers 108, 110 with higher energy phonon modes that do not couple efficiently with the charge carriers in the n-graphene layer 102.

Therefore, with reference to FIG. 1, the under-layer 108 and over-layer 110 are each constructed of a material having a high dielectric constant, and a highly ordered crystalline structure to minimize the extrinsic effects that deteriorate the n-graphene layer's 102 electronic properties. The role of the layers 108, 110, having a large dielectric constant, is to mitigate the Coulomb scattering role of charged impurities on or near the n-graphene layer 102. The high dielectric constant allows a large fraction of electric field lines originating form a charged impurity to terminate within it rather than penetrate through it and the n-graphene layer, thereby lowering the Coulombic interactions between the charged impurity and the charge carriers in the n-graphene layer 102. Various high-quality insulating materials possessing a high dielectric constant and low crystalline defects can be used in the layers 108, 110. The larger the dielectric constant is the larger the potential to reduce the effect of charge impurity scattering. To this end, suitable materials for use in the layers 108 110 include $HfO_2$, $Al_2O_3$, $Si_3N_4$, $Y_2O_3$, PrO, GdO, $La_2O_3$, TiO, ZrO, AlN, BN, SiC, $Ta_2O_5$, $SrTiO_3$, $Ba_xSr_{1-x}$, $TiO_3$, $Pb_xZr_{1-x}$, and $TiO_3$. The surface 116 of the under-layer 108 and the surface 118 of the over-layer 110 should be as close to atomically flat as possible to reduce corrugations (and hence a source of short range scattering) in the n-graphene layer 102.

The structure described in FIG. 1 illustrates a somewhat generic example of how a n-graphene layer 102 can be placed between a suitable under-layer 108 and over-layer 110 in order to maximize the performance of the n-graphene layer 102. The number, arrangement and material selection of other elements of the structure will depend upon the application in which the n-graphene layer 102 is used. For example, the size, material selection and number of electrical leads 104, 106 will depend upon what type of device is being constructed. Similarly, the material of the substrate 112 depends upon the device being constructed and can include materials such as, but not limited to Si, $SiO_2$, $Al_2O_3$, GaAs, SiC, glass, N58, ceramics, polymers or any other materials suitable for use in an electronic substrate.

Figure 2:
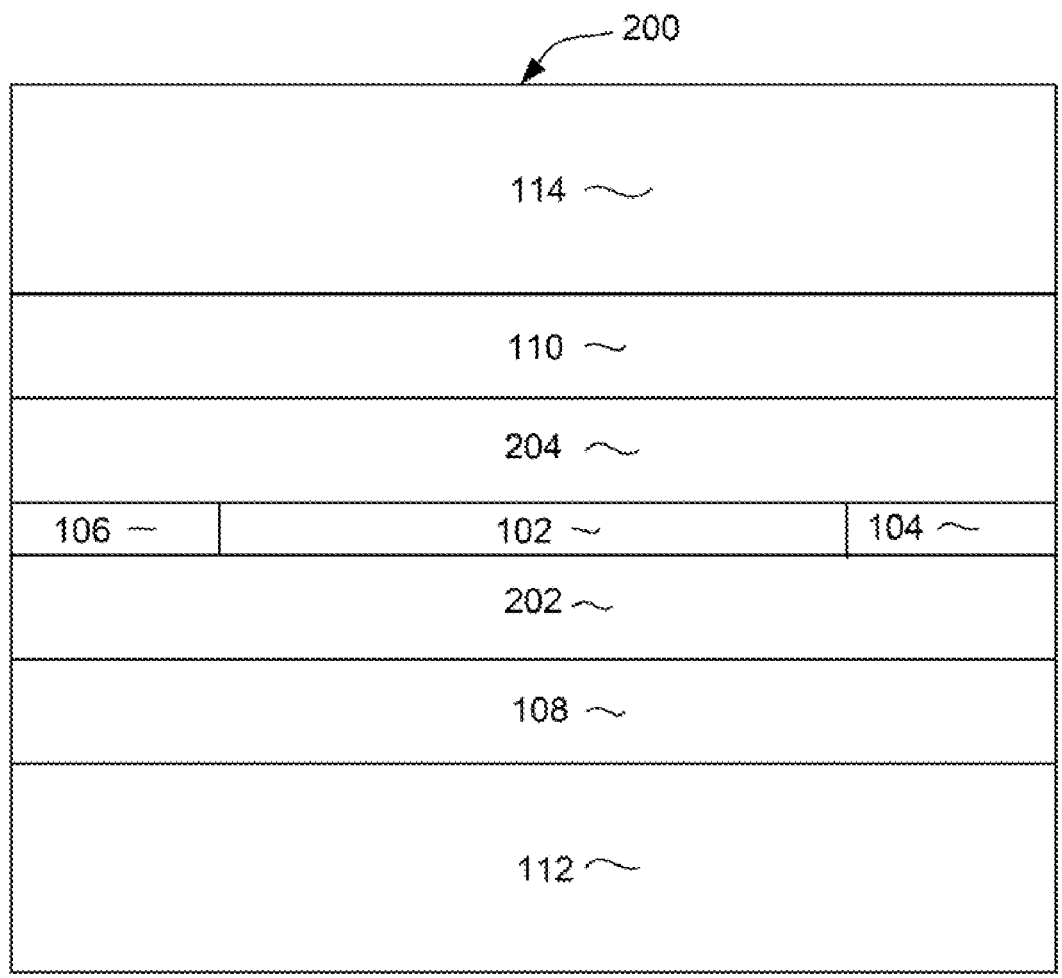
FIG. 2 is a schematic, cross sectional view of a structure employing graphene according to an alternate embodiment of the invention.

FIG. 2 illustrates another embodiment of the invention. FIG. 2 illustrates a device 200 having a structure similar to that of FIG. 1, having an n-graphene layer 102 located between an under-layer 108 and an over-layer 110. However, the device 200 also includes a layer 202 located between the under-layer 108 and the n-graphene layer 102 and a layer 204 located between the over-layer 110 and the n-graphene layer 102. As with the previously described embodiment, the layers 108, 110 can each be constructed of a high dielectric, high crystalline ordered material such as $HfO_2$, $Al_2O_3$, $Si_3N_4$, $Y_2O_3$, PrO, GdO, $La_2O_3$, TiO, ZrO, AlN, BN, SiC, $Ta_2O_5$, $SrTiO_3$, $Ba_xSr_{1-x}$, $TiO_3$, $Pb_xZr_{1-x}$, or $TiO_3$.

Many of the above described materials for use in the layers 108, 110 are also highly polar, and the close proximity of polar groups to graphene layers can provide a scattering mechanism known as remote interfacial scattering. The scattering rate through remote interfacial scattering mechanisms is a function of the energy of the surface optical phonon modes of the dielectric and the separation between the dielectric and the n-graphene layer 102. Out of the above described materials, AlN, SiC, BN, TiO2, $ZrO_2$ and $SrTiO_3$ have high frequency optical phonon modes which couple less efficiently to charge carriers in the n-graphene layer 102 and hence reduce scattering effects. To mitigate the effects of remote interfacial scattering but retain the Coulomb screening of charged impurities of layers 108, 110, the material chosen for the interfacial layers 202, 204 preferably possesses the following properties. It should have a low thickness so that the effective dielectric constant of the entire layer stack comprising layers 108, 202, 102, 204 and 110 is not greatly reduced by the addition of the interfacial layers 202 and 204. Also, it should have a weak frequency dependence of its dielectric function to avoid introducing additional remote interfacial scattering effects. Examples of materials suitable for use in the interfacial layers 202, 204 include self-assembled monolayers such as: 18-phenoxyoctadecyl-trichlorsilane, octadecyltrichlorsilane, poly(a-methylstyrene) or nanometer-thick layers of polymers such as polyethylene, polypropylene and polystyrene. Furthermore, as an alternative to or in addition to the use of the interfacial layers 202, 204, the under-layer 108 and/or over-layer 110 can be alloyed or modified with respect to its bulk properties so as to raise the energy of the surface optical modes leading to remote interfacial scattering. This can be achieved by, for example, crystal strain engineering or alloying. It is also noted that the addition of the interfacial layers 202 and 204 can reduce the deleterious effect of remote interfacial phonon scattering originating from the commonly used $SiO_2$ used in layers 108 and 110.

Figure 3:
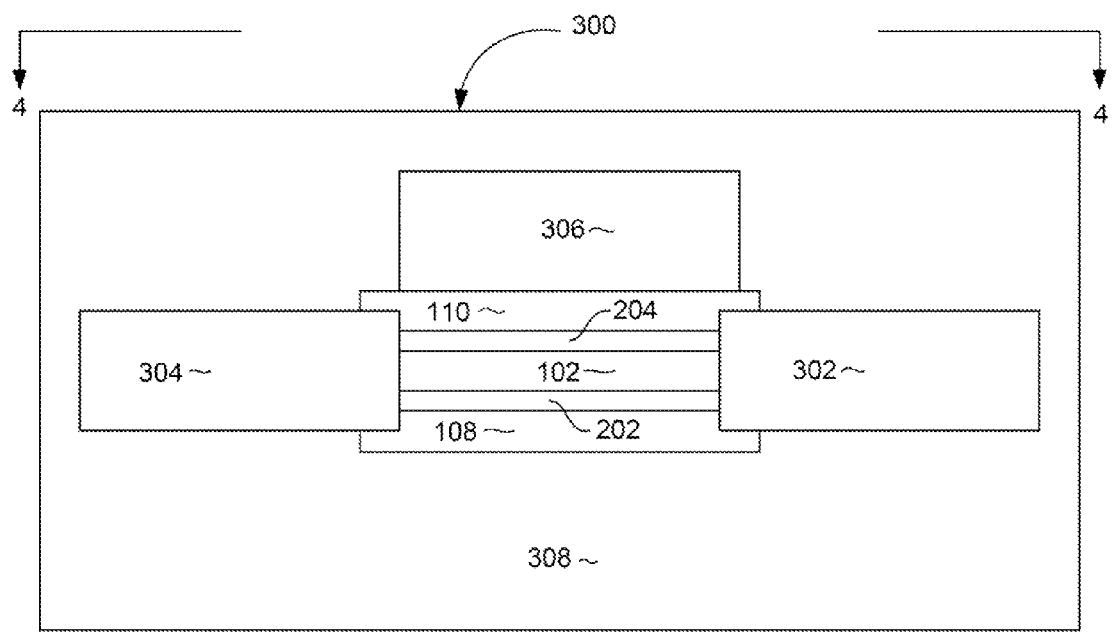
FIG. 3 is a schematic, cross sectional showing a graphene structure employed in a field effect transistor illustrating a possible application of a graphene structure according to an embodiment of the invention.
Figure 4:
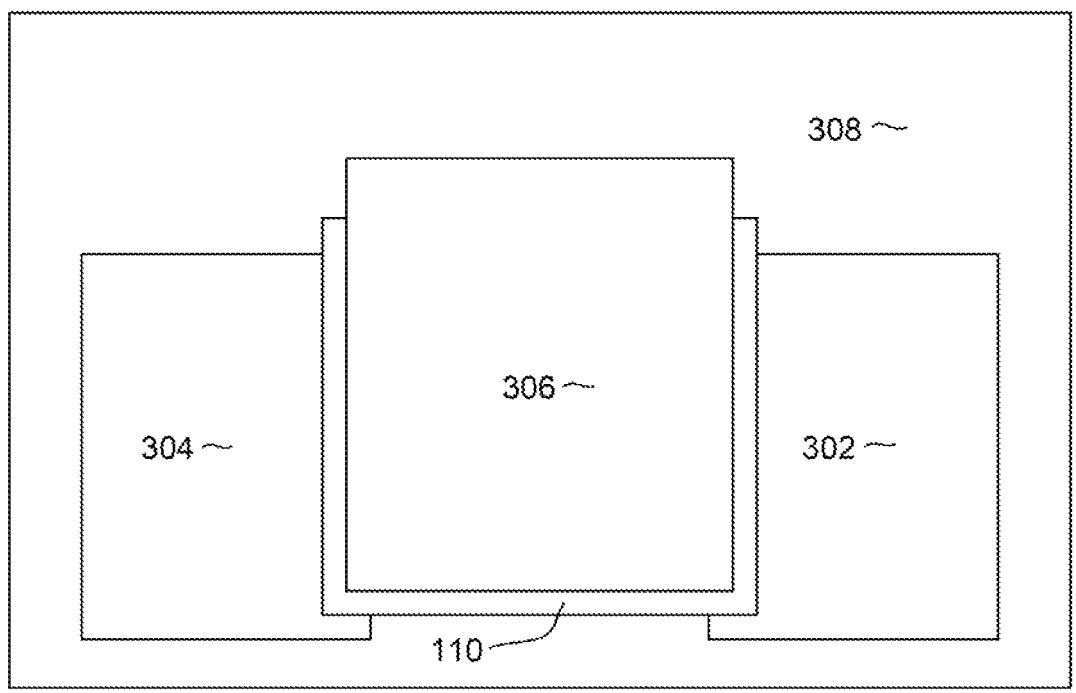
FIG. 4 is a top down view of the structure of FIG. 3, as viewed from line 4-4 of FIG. 3.

FIGS. 3 and 4 illustrate a possible environment in which the present invention might be used. FIG. 4 is a top down view as viewed from line 4-4 of FIG. 3. FIG. 3 shows a cross sectional, schematic view of a field effect transistor 300 that includes an n-graphene layer 102 that is located between an under-layer 108 and over-layer 110, which both can be constructed of the materials suggested above. An optional interfacial layer 202, 204 can be located between the under-layer 108 and over-layer 110 and the n-graphene layer 102 respectively (as described above with reference to FIG. 2).

A source electrode 302 and drain electrode 304 can be connected with opposite sides of the n-graphene layer 102. A top-gate electrode 306 can be provided above the n-graphene layer 102, interfacial layer 204 and over-layer 110. Other additional dielectric layers, not shown, can be interposed between the top-gate electrode 306 and the layers 102, 104, 110 if desired. These layers can all be surrounded by a substrate or fill layer 308 as necessary in a practical FET device. The above description is merely an example of an environment in which the present invention might be used. Other transistor structures (or other electronic devices altogether) employing an under-layer 108, over-layer 110, and interfacial layers 202, 204 may occur to one skilled in the art are considered to fall within the scope of the invention as well.

Figure 5:
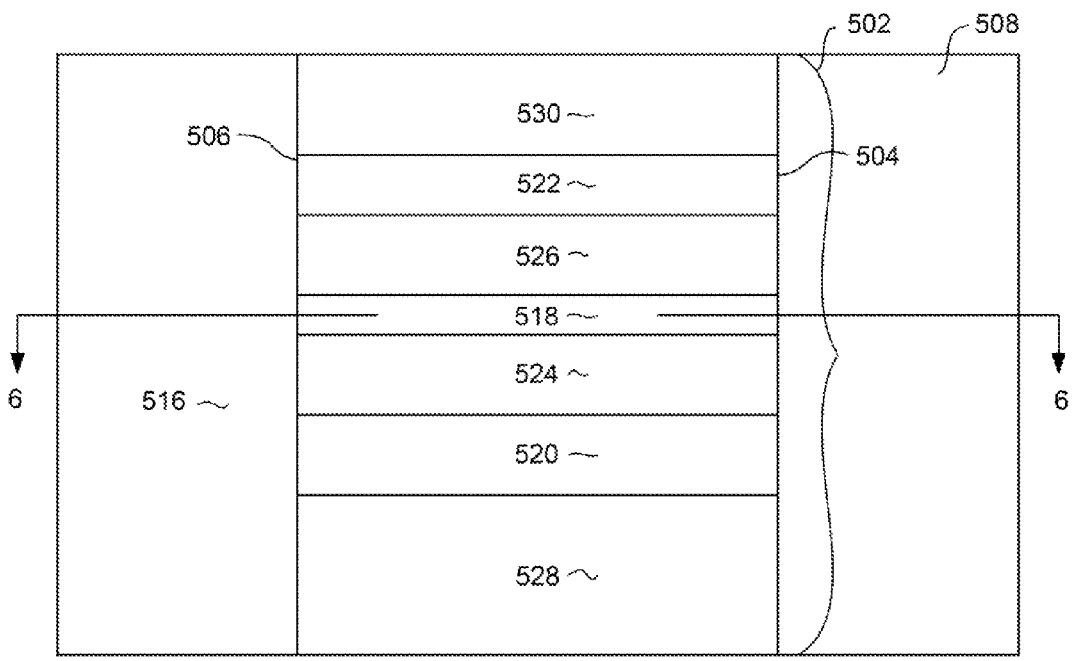
FIG. 5 is a schematic, cross sectional view of a Lorentz magnetoresistive sensor, illustrating a possible application of a graphene structure according to an embodiment of the invention.
Figure 6:
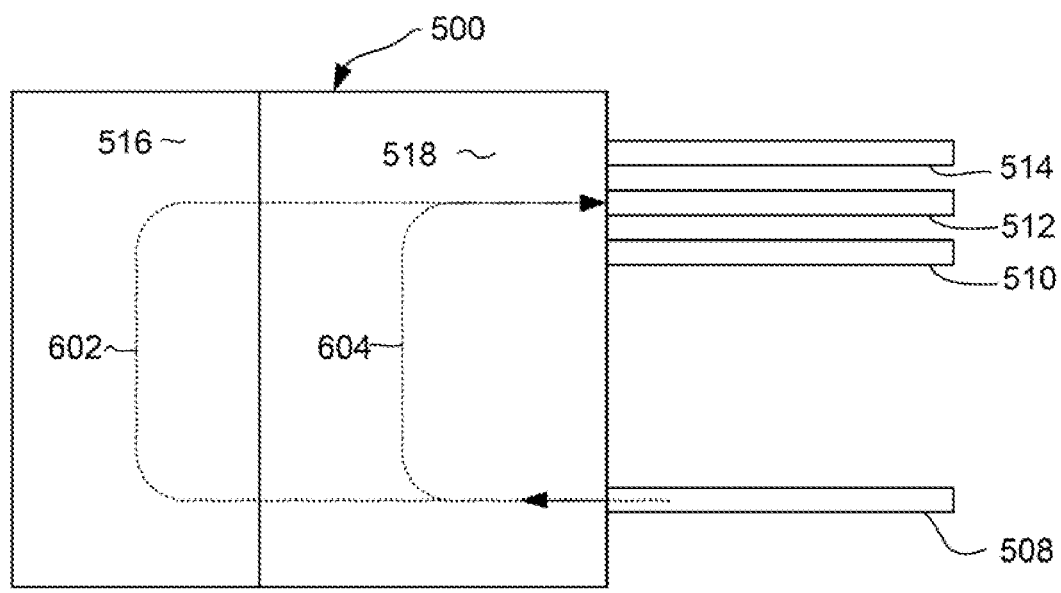
FIG. 6 is a view of the structure of FIG. 5 as viewed from line 6-6 of FIG. 5.

With reference now to FIGS. 5 and 6, another environment in which the invention may be used is illustrated. FIGS. 5 and 6 show a magnetoresistive sensor 502 that employs the effect of the Lorentz forces on charged carriers to detect the presence of a magnetic field. Such a magnetoresistive sensor can be referred to as a Lorentz magnetoresistive sensor.

With reference to FIG. 5, the sensor 500 includes a mesa structure 502 having first and second opposed sides 504, 506. At one side 504 of the mesa structure are a plurality of leads I1 (508), V1 (510), I2 (512), V2 (514), only one of which is shown in FIG. 5. At the opposite side 506 of the mesa structure 502 is an electrically conductive shunt structure 516 that can be constructed of a non-magnetic, electrically conductive material such as Cu or Au.

The mesa structure 502 includes an n-graphene layer 518, which as described above can be a single layer of graphene or can be a plurality of n single layers of graphene. Preferably, the layer of n-graphene 518 includes n=1 to n=10 single layers of graphene. As with the example discussed with reference to FIGS. 1 and 2, the n-graphene layer 518 is located between an under-layer 520 and over-layer 522 and between optional interfacial layers 524, 526. If the interfacial layers 524, 526 are present they are each located between the n-graphene layer 518 and one of the over and under layers 520, 522. Some sort of substrate layer 528 may optionally be provided below the under-layer 520 and can be constructed of a non-magnetic, electrically insulating material such as alumina, $SiO_2$, etc. A capping layer 530 may also be provided at the top of the mesa structure to protect the other layers, and may also be constructed of a variety of materials such as alumina, $SiO_2$, etc.

The n-graphene layer 518 is the magnetically active layer of the structure as will be seen below, and is sandwiched between the interfacial layers 524, 526, if present. As described above, the interfacial layers can be constructed of a material such as self-assembled monolayers such as: 18-phenoxyoctadecyl)-trichlorsilane, octadecyltrichlorsilane, poly (a-methylstyrene) or nanometer-thick layers of polymers such as polyethylene, polypropylene and polystyrene. The graphene layer 518 and interfacial layers 524, 526 are sandwiched between the under and over layers 524, 526, which as described above can be constructed of materials such as $SiO_2$, $HfO_2$, $Al_2O_3$, $Si_3N_4$, $Y_2O_3$, PrO, GdO, $La_2O_3$, TiO, ZrO, AlN, BN, SiC, $Ta_2O_5$, $SrTiO_3$, $Ba_xSr_{1-x}$, $TiO_3$, $Pb_xZr_{1-x}$, or $TiO_3$.

FIG. 6 shows a top-down sectional view as seen from line 6-6 of FIG. 5, and can be useful for illustrating the operation of the sensor 500. The leads I1 508 and I2 512 provide a current to the n-graphene layer 518. In the absence of a magnetic field, most of the current from one of the current leads 508 passes to the shunt 516 where it is shunted through at relatively low resistance before passing back to the other lead 512. This current path is indicated by dotted line 602. However, in the presence of a magnetic field that is oriented perpendicular to the plane of the layers, and perpendicular to the page in FIG. 6, Lorentz forces acting on charge carriers cause more of the current to be deflected away from the shunt as indicated by dotted line 604. This results in an overall increase in resistance, and which can be detected by voltage leads 510, 514, indicating the presence of a magnetic field.

FIGS. 5 and 6 merely illustrate a possible embodiment of a device in which the n-graphene layer 518 can be used. This is by way of example only, however, and many other types of Lorentz magnetoresistive devices can be constructed that would also benefit from the use of the graphene layer sandwiched between interface layers 524, 526 and under and over layers 520, 522 and optional interfacial layers 524, 526. In addition, many other devices other than magnetoresistive devices may also include the use of an n-graphene layer 518 sandwiched between these layers 520, 522, 524, 526.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. An electronic device, comprising:
   an under-layer constructed of a highly ordered crystalline material having a high dielectric constant;
   an over-layer constructed of a crystalline material having a high dielectric constant; and
   a layer of n-graphene located between the over-layer and the under-layer;
   wherein the under-layer has a substantially atomically flat surface that contacts the n-graphene layer, with root mean square roughness of less than 0.5 nm.

2. The electronic device as in claim 1 wherein the n-graphene layer consists of a single layer of graphene.

3. The electronic device as in claim 1 wherein the n-graphene layer comprises a plurality of layers of graphene.

4. The electronic device as in claim 1 wherein the n-graphene layer consists of 1 to 10 layers of graphene.

5. The electronic device as in claim 1 wherein the n-graphene layer is sandwiched between and contacts each of the under-layer and over-layer.

6. The electronic device as in claim 1 wherein the over-layer has a substantially atomically flat surface that contacts the n-graphene layer, with root mean square roughness of less than 0.5 nm.

7. The electronic device as in claim 1 wherein the under-layer and/or over-layer have a dielectric constant of at least 4.

8. The electronic device as in claim 1 further comprising a plurality of electrically conductive leads connected with the n-graphene layer for supplying charge carriers to the graphene layer.

9. The electronic device as in claim 1 wherein the device is a field effect transistor.

10. The electronic device as in claim 1 wherein the device is a magnetoresistive sensor.

11. An electronic device, comprising:
an under-layer constructed of a highly ordered crystalline material having a high dielectric constant;
an over-layer constructed of a crystalline material having a high dielectric constant; and
a layer of n-graphene located between the over-layer and the under-layer;
wherein the under-layer and over-layer have a substantially atomically flat surface that contacts the n-graphene layer, with root mean square roughness of less than 0.5 nm.

12. An electronic device, comprising:
an n-graphene layer;
first and second interfacial layers comprising a non-polar dielectric material, the n-graphene layer being sandwiched between the first and second interfacial layers;
an under-layer comprising a crystalline material having a high dielectric constant; and
an over-layer comprising a crystalline material having a high dielectric constant; wherein
the n-graphene layer and first and second interfacial layers are sandwiched between the under-layer and the over-layer;
wherein the under-layer has a substantially atomically flat surface that contacts the n-graphene layer, with root mean square roughness of less than 0.5 nm.

13. The electronic device as in claim 12 wherein the each of the interfacial layers comprises a material having a weak frequency dependence of its dielectric constant.

14. The electronic device as in claim 12 wherein each of the interfacial layers is no greater than 10 nm thick.

15. The electronic device as in claim 12 wherein the first and second interfacial layers each comprise self-assembled monolayers such as: 18-phenoxyoctadecyl)-trichlorsilane, octadecyltrichlorsilane, poly(a-methylstyrene) or nanometer-thick layers of polymers such as polyethylene, polypropylene and polystyrene.

16. The electronic device as in claim 12, wherein:
the first and second interfacial layers each comprise self-assembled monolayers such as: 18-phenoxyoctadecyl)-trichlorsilane, octadecyltrichlorsilane, poly(a-methylstyrene) or nanometer-thick layers of polymers such as polyethylene, polypropylene and polystyrene; and
the over-layer and under-layer each comprise $SiO_2$, $HfO_2$, $Al_2O_3$, $Si_3N_4$, $Y_2O_3$, PrO, GdO, $La_2O_3$, TiO, ZrO, AlN, BN, SiC; $Ta_2O_5$, $SrTiO_3$, $Ba_xSr_{1-x}$, $TiO_3$, $Pb_xZr_{1-x}$, or $TiO_3$.

17. The electronic device as in claim 12 wherein the device is a field effect transistor.

18. The electronic device as in claim 12 wherein the device is a magnetoresistive sensor.

* * * * *